(12) United States Patent  
Wholey et al.

(10) Patent No.: US 8,536,707 B2  
(45) Date of Patent: Sep. 17, 2013

(54) SEMICONDUCTOR STRUCTURE COMPRISING MOISTURE BARRIER AND CONDUCTIVE REDISTRIBUTION LAYER

(75) Inventors: James Wholey, Saratoga, CA (US); Ray Myron Parkhurst, Santa Clara, CA (US); Marshall Maple, Cupertino, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/306,708

(22) Filed: Nov. 29, 2011

(65) Prior Publication Data  
US 2013/0134560 A1 May 30, 2013

(51) Int. Cl.  
*H01L 23/52* (2006.01)

(52) U.S. Cl.  
USPC ........... 257/758; 257/760; 257/774; 438/627; 438/643; 438/653

(58) Field of Classification Search  
USPC . 257/737, 751, 758, 760, 774; 438/618–624, 438/637–638, 672–673, 643, 653  
See application file for complete search history.

(56) References Cited

U.S. PATENT DOCUMENTS

| | | | |
|---|---|---|---|
| 5,578,841 A | 11/1996 | Vasquez et al. | |
| 6,472,738 B2 | 10/2002 | Suzuki | |
| 6,753,608 B2 | 6/2004 | Tomita | |
| 7,230,337 B2 | 6/2007 | Usami et al. | |
| 7,372,154 B2 | 5/2008 | Tanaka et al. | |
| 7,429,502 B2 | 9/2008 | Archer, III et al. | |
| 7,642,128 B1 | 1/2010 | Lin et al. | |
| 7,906,851 B2 | 3/2011 | Watanabe | |
| 2002/0171138 A1 | 11/2002 | Osone et al. | |
| 2006/0170113 A1 | 8/2006 | Tanaka et al. | |
| 2006/0261483 A1* | 11/2006 | Tsumura et al. | 257/758 |
| 2007/0023904 A1 | 2/2007 | Salmon et al. | |
| 2007/0023923 A1 | 2/2007 | Salmon et al. | |
| 2007/0184579 A1 | 8/2007 | Huang et al. | |
| 2008/0093746 A1 | 4/2008 | Lee et al. | |
| 2008/0296690 A1 | 12/2008 | Anderson et al. | |
| 2009/0008801 A1 | 1/2009 | Lai et al. | |
| 2010/0007021 A1* | 1/2010 | Choo et al. | 257/751 |
| 2010/0059853 A1 | 3/2010 | Lin et al. | |
| 2010/0133704 A1 | 6/2010 | Marimuthu et al. | |
| 2010/0219527 A1 | 9/2010 | Feustel et al. | |
| 2011/0156220 A1 | 6/2011 | Koagawa et al. | |
| 2012/0025370 A1* | 2/2012 | Wholey et al. | 257/737 |

OTHER PUBLICATIONS

Co-pending U.S. Appl. No. 13/075,493, filed Mar. 30, 2011.  
Co-pending U.S. Appl. No. 12/846,060, filed Jul. 29, 2010.

* cited by examiner

*Primary Examiner* — Dung A. Le

(57) ABSTRACT

A semiconductor structure includes semiconductor devices on a substrate, a moisture barrier on the substrate surrounding the semiconductor devices, and a metal conductive redistribution layer formed over the moisture barrier. The metal conductive redistribution layer and the moisture barrier define a closed compartment containing the semiconductor devices.

18 Claims, 9 Drawing Sheets

SEMICONDUCTOR STRUCTURE COMPRISING MOISTURE BARRIER AND CONDUCTIVE REDISTRIBUTION LAYER

BACKGROUND

Packaged semiconductor devices are affected by exposure to environment, particularly moisture. The semiconductor devices typically include dielectric materials on various surfaces, which may be permeable or otherwise may crack or become defective, enabling moisture to penetrate the electrical circuits. The moisture may cause short circuits, as well as disintegrate the components within the packaged semiconductor device.

FIG. 1 shows a cross-sectional view of an end portion of a conventional semiconductor structure 100, including an illustrative moisture path. The semiconductor structure 100 comprises substrate 101, which includes a collector 102 formed therein by known methods. A base 103 is provided over the collector 102, and an emitter 104 is provided over the collector 102 to provide an active semiconductor device, such as a heterojunction bipolar transistor (HBT).

Contacts 105 are made to the base layer 103 and the collector layer 102. A first metal layer 106 is provided on the contacts 105 and the emitter layer 104. A second metal layer 107 is provided on the first metal layer 106. The first metal layer 106 and the second metal layer 107 are used for routing signals to and from the HBT. A protective dielectric layer is provided on the second metal layer 107, the protective dielectric layer comprising a first dielectric layer 121 and a second dielectric layer 122 formed on a planar top surface of the first dielectric layer 121. The first and second dielectric layers 121 and 122 provide isolation and limited protection of the HBT, and may be formed of silicon nitride and benzocyclobutene (BCB), respectively. A base dielectric layer 108 formed of BCB or polyimide, for example, is provided beneath the first dielectric layer 121 and provides a planar surface on which the first dielectric layer 121 is formed.

The first metal layer 106 is selectively disposed over the contacts 105 to the base 103 and the collector 102, and over the emitter 104, and the second metal layer 107 is selectively disposed over the first metal layer 106. The second metal layer 107 may include signal traces, such as trace 107A, for carrying electrical signals to and from the collector 102 and electrical ground traces for connection to the emitter 104. In addition, collector Vcc bias structure 115 is shown between the outermost HBT and the outer edge 144 of the base dielectric layer 108. The collector Vcc bias structure 115 includes trace 107E of the second metal layer 107 stacked on trace 106E of the first metal layer 106.

Edge and top portions of the semiconductor structure 100 are exposed to moisture, indicated generally by illustrative moisture path 145. That is, moisture is able to penetrate the base dielectric layer 108, through the outer edge 144 and/or through the first and second dielectric layers 121 and 122. The moisture may be able to reach the HBT or other portions of the semiconductor structure 100, and cause electrical shorts, particularly if cracking or other defects exit in the base dielectric layer 108, or the first and second dielectric layers 121 and 122. There is a need, therefore, for a moisture barrier to prevent seepage of moisture, in order to prevent short circuits and other defects from occurring in the semiconductor structure.

SUMMARY

In a representative embodiment, a semiconductor structure includes multiple semiconductor devices on a substrate, a moisture barrier on the substrate surrounding the semiconductor devices, and a metal conductive redistribution layer formed over the moisture barrier. The metal conductive redistribution layer and the moisture barrier define a closed compartment containing the semiconductor devices.

In another representative embodiment, a semiconductor structure includes multiple semiconductor devices on a substrate; a metal layer disposed over the semiconductor devices, the metal layer comprising at least a first trace and a second trace; and a moisture barrier on the substrate surrounding the semiconductor devices substantially along a periphery of the semiconductor structure, the moisture barrier comprising a third trace formed as part of the metal layer. The semiconductor structure further includes a protective dielectric layer disposed on the metal layer over the semiconductor devices and the moisture barrier, and a conductive redistribution layer disposed on protective dielectric layer. The conductive redistribution layer and the moisture barrier define a closed compartment containing the semiconductor devices.

In another representative embodiment, a semiconductor structure includes a metal layer disposed over a semiconductor device, the metal layer comprising at least a first trace, a second trace and a third trace separated by a base dielectric layer; a moisture barrier comprising the third trace of the metal layer; a protective dielectric layer selectively disposed on the metal layer; a metal conductive redistribution layer disposed on the protective dielectric layer, the conductive redistribution layer and the moisture barrier defining a closed compartment containing the semiconductor device; and a conductive pillar on the metal conductive redistribution layer. The conductive pillar is in electrical contact with the first trace of the metal layer via the metal conductive redistribution layer, and the protective dielectric layer electrically isolates the second trace from the conductive pillar.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments. Further, it is understood that the various configurations of electrical components and connections depicted in the figures are illustrative, and therefore may vary without departing from the scope of the present teachings.

Generally, various embodiments include a semiconductor structure having a moisture barrier surrounding active and passive semiconductor devices formed on a substrate, thus forming a "guard ring." A conductive redistribution layer, including copper, for example, is formed over the moisture barrier, such that the conductive redistribution layer and the moisture barrier define a closed compartment containing the semiconductor devices.

Figure 2A:
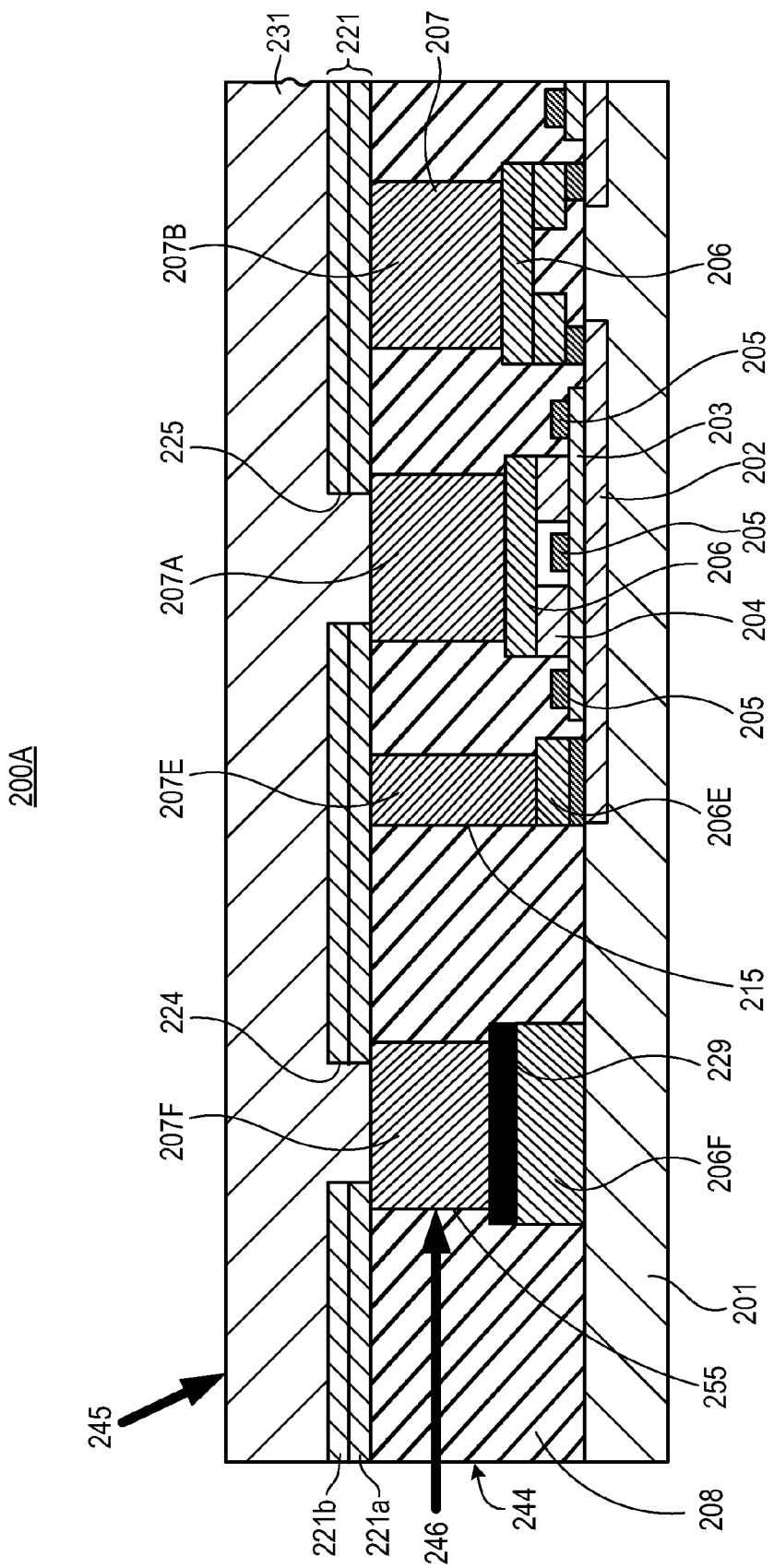
FIGS. 2A-2D show cross-sectional views of semiconductor structures with moisture barrier and conductive redistribution layer in accordance with representative embodiments.

FIG. 2A shows a cross-sectional view of a semiconductor structure 200A in accordance with a representative embodiment. The semiconductor structure 200A includes a substrate 201 which may be selected based on an active semiconductor device fabricated thereon. In certain embodiments, the substrate 201 includes a semiconductor material. Illustrative semiconductor materials for the substrate 201 include binary semiconductor materials (e.g., Group III-IV and Group IV-VI semiconductor materials), ternary semiconductor materials, silicon (Si) and silicon-germanium (SiGe). Moreover, the present teachings contemplate the use of synthetic diamond for the substrate 201 fabricated by a known chemical vapor deposition (CVD) method, for example.

As should be appreciated, the selection of the active semiconductor device and the material for the substrate 201 dictates the processing techniques and materials selected for fabricating the active semiconductor device and other components of the semiconductor structure 200A. Such techniques and materials are within the purview of one of ordinary skill in the art of semiconductor processing and are generally not detailed herein to avoid obscuring the description of the representative embodiments.

For ease of description, the substrate 201 includes gallium arsenide (GaAs), and the active semiconductor device is a heterojunction bipolar transistor (HBT). It is emphasized that the selection of GaAs for the substrate 201 and the selection of the HBT device are merely illustrative, and other substrate materials and active devices are contemplated. Illustratively, the active device may be a pseudomorphic high electron mobility transistor (pHEMT), or an enhanced pseudomorphic high electron mobility transistor (E-pHEMT). Alternatively, the substrate may include silicon and the active device may include a metal oxide semiconductor (MOS) device, such as a MOS field effect transistor (MOSFET), or complementary MOS (CMOS) device. Additionally, a combination of different active devices may be provided over the substrate 201 to provide a desired circuit. Furthermore, the active devices of the semiconductor structure 200A may provide power amplifiers and other devices that require heat dissipation. While such power devices are illustrative, other active semiconductor devices that do not require the same degree of heat dissipation as power devices (e.g., power amplifiers) are contemplated to be included in the semiconductor structure 200A.

The semiconductor structure 200A may further include passive semiconductor devices, which also may be referred to passive electrical components (not shown in FIG. 2A), formed in or over the substrate 201 in addition to the active semiconductor devices referenced above. The combination of active semiconductor devices and passive electrical components provides electrical circuits of the semiconductor structure 200A. Passive electrical components include resistors, capacitors, signal transmission lines (transmission lines), and inductors, for example. These passive electrical components may be selectively electrically connected to the active semiconductor device(s) to provide a desired circuit. The passive electrical components may be fabricated using known methods and materials. Notably, the various current-carrying traces of the semiconductor structure 200A can function as transmission lines and inductors. In certain embodiments, only passive electrical components are provided, and rather than a semiconductor material, the substrate 201 may include an insulator, such as a suitable glass material or sapphire.

Referring again to FIG. 2A, the representative HBT includes a collector 202, a base 203 and an emitter 204 formed in/over the substrate 201 with known materials and by known methods. Ohmic contacts ("contacts") 205 are selectively provided to the base 203 and the collector 202 as shown. Contacts 205 are generally gold (Au) and are formed by known methods. In the representative embodiment, a first metal layer 206 is selectively disposed over the contacts 205 to the base 203 and the collector 202, and over the emitter 204. Illustratively, the first metal layer 206 comprises gold. Alternatively, the first metal layer 206 may include aluminum (Al), copper (Cu) or other conductive material compatible with semiconductor processes.

The first metal layer 206 includes signal traces for carrying electrical signals to and from the emitter 204, the base 203 and the collector 202 of the HBT. As discussed more fully below, the first metal layer 206 also includes electrical ground traces and thermal paths for heat dissipation. Trace widths of the signal and ground traces of the first metal layer 206 can be less than approximately 1.0 µm to greater than approximately 100 µm, for example. Typically, however, the trace widths of the signal and ground traces of the first metal layer 206 are in the range of approximately 2.0 µm to approximately 20.0 µm. Moreover, the thickness of the signal and ground traces of the first metal layer 206 is illustratively in the range of approximately 0.2 µm to approximately 2.0 µm.

The semiconductor structure 200A also includes a second metal layer 207 selectively disposed over the first metal layer 206. In the representative embodiment, the second metal layer 207 includes signal traces for carrying electrical signals to and from the collector 202, electrical ground traces for connection to the emitter 204, and provides thermal paths for heat dissipation. Illustratively, the second metal layer 207 includes gold. Alternatively, the second metal layer 207 may include aluminum, copper or other conductive material compatible with semiconductor processes. Trace widths of the signal and ground traces of the second metal layer 207 are typically in the range of approximately 3.0 µm to approximately 50.0 µm, for example. Moreover, the thickness of the signal and ground traces of the second metal layer 207 is illustratively in the range of approximately 1.0 µm to approximately 4.0 µm.

The semiconductor structure 200A also includes a base dielectric layer 208 (hereinafter dielectric layer 208) selectively disposed over the HBT (or other active and passive semiconductor device(s)), the contacts 205, the first metal layer 206, and the second metal layer 207. The dielectric layer 208 provides electrical isolation of certain traces of the first metal layer 206 and of the second metal layer 207, and mechanical support of layers disposed over the dielectric layer 208. In certain representative embodiments, the dielectric layer 208 includes silicon nitride ($Si_3N_4$), silicon dioxide ($SiO_2$), aluminum nitride (AlN) or an oxynitride (e.g., aluminum oxynitride), for example. As discussed more fully below, the selection of one of these dielectric materials provides the advantage of improved thermal conductivity for heat dissipation, as well as selective electrical isolation of the contacts 205, and the respective traces of the first metal layer 206 and the second metal layer 207. Alternatively, the dielectric layer 208 may include a known spun-on dielectric, such as BCB or polyimide or a combination of BCB or polyimide, and silicon oxide, silicon nitride or silicon oxynitride. For example, in a representative embodiment, the dielectric layer 208 may include a layer of BCB that is "spun on," and subsequently covered with a layer of silicon nitride by a known technique.

In the depicted embodiment, collector Vcc bias structure 215 is shown adjacent the outermost HBT, although alternative configurations may not include a collector Vcc bias structure 215, in which case the HBT itself or another (active or passive) electrical component is the closest to outer edge 244 of the dielectric layer 208. The collector Vcc bias structure 215 includes trace 207E of the second metal layer 207 stacked on trace 206E of the first metal layer 206. The dielectric layer 208 is selectively disposed over the HBT, the collector Vcc bias structure 215, the contacts 205, the first metal layer 206 and the second metal layer 207, providing electrical isolation of certain traces and mechanical support of layers disposed over the dielectric layer 208, as discussed above.

As shown in FIG. 2A, a protective dielectric layer 221 is provided on the second metal layer 207 and the dielectric layer 208, and a conductive redistribution layer 231 is formed on a planar top surface of the protective dielectric layer 221. The protective dielectric layer 221 provides electrical isolation from the conductive redistribution layer 231, selectively, as well as mechanical support of the conductive redistribution layer 231. In certain representative embodiments, the protective dielectric layer 221 may be formed of two layers, first dielectric layer 221a and second dielectric layer 221b. For example, the first dielectric layer 221a may be formed of $Si_3N_4$ having a thickness of about 0.3 μm, and the second dielectric layer 221b may be formed of BCB having a thickness of about 2.0 μm.

Figure 1:
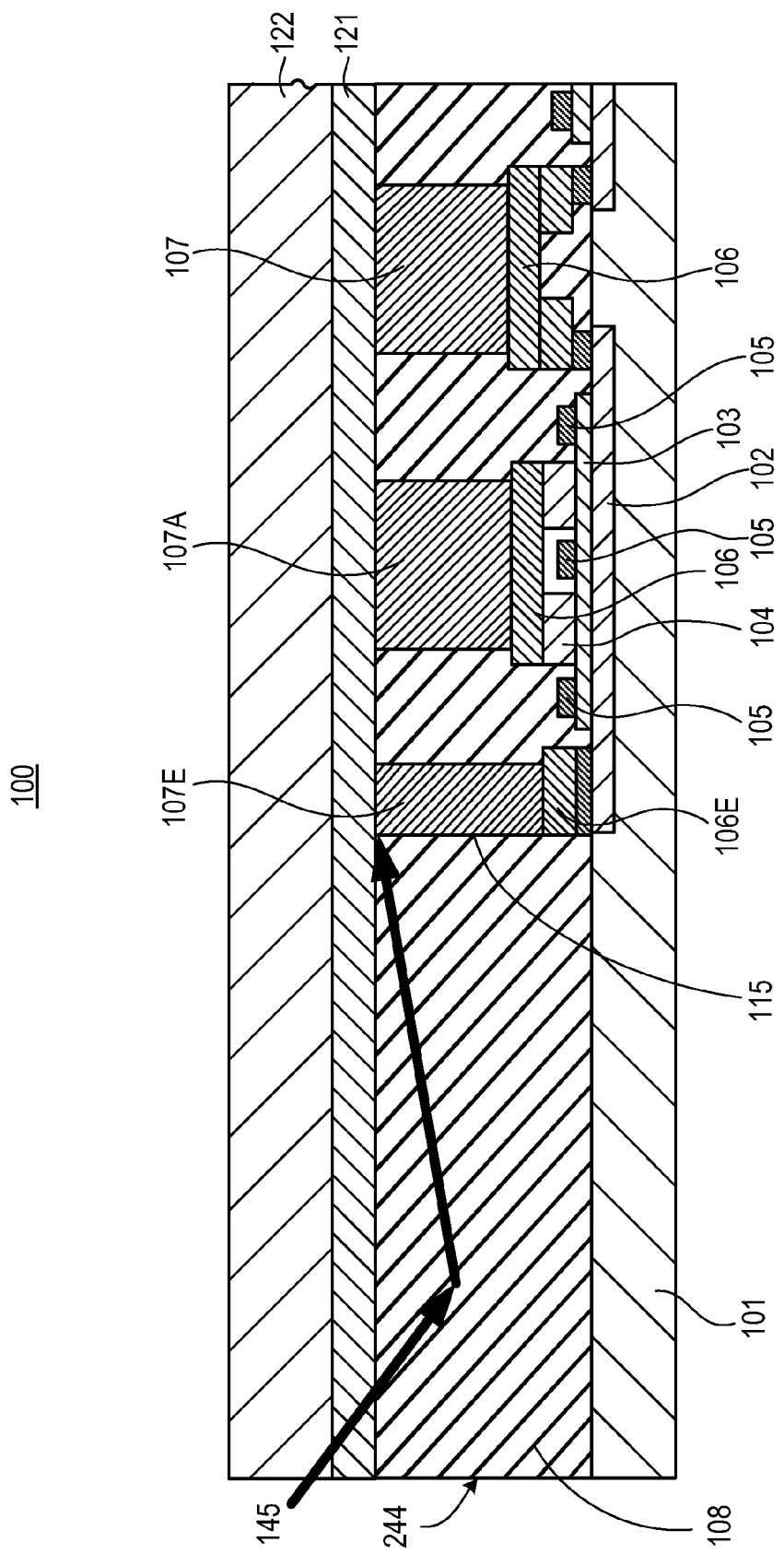
FIG. 1 shows a cross-sectional view of a conventional semiconductor structure.

The conductive redistribution layer 231 provides protection from the environment, including moisture. The conductive redistribution layer 231 is formed of a conductive material, such as metal material, including copper, for example. The metal provides significantly better moisture protection than a dielectric material, such as the first and second dielectric layers 121 and 122 discussed above with reference to FIG. 1. The electrical conductivity and moisture resistance properties of copper are advantageous over other conductors, although other electrically conductive materials are contemplated for use in the conductive redistribution layer 231, such as aluminum (Al), silver (Ag) or a solder material such as tin (Sn). The thickness of the conductive redistribution layer 231 may be approximately 10 μm, for example.

The conductive redistribution layer 231, together with moisture barrier 255, forms a closed compartment that houses the electrical components (active and passive) of the semiconductor structure 200A, not just the depicted illustrative HBT. That is, in an embodiment, the moisture barrier 255 is located at or near the outer edge 244 of the dielectric layer 208, and surrounds the electrical circuitry of the semiconductor structure 200A to form a "guard ring." The guard ring may be formed peripherally around the semiconductor structure 200A. The conductive redistribution layer 231 forms a lid or cover over the guard ring, thus protecting the enclosed electrical components, e.g., from moisture. Accordingly, the conductive redistribution layer 231 blocks illustrative moisture path 245, and the moisture barrier 255 blocks illustrative moisture path 246. In various configurations, the closed compartment defined by the conductive redistribution layer 231 and the moisture barrier 255 may include one or more gaps to enable electrical connections outside the guard ring, as discussed below with reference to FIG. 6.

In the depicted embodiment, the moisture barrier 255 includes trace 206F of the first metal layer 206 on substrate 201, insulating spacer 229 stacked on the trace 206F, and trace 207F of the second metal layer 207 stacked on the insulating spacer 229. The moisture barrier 255 is surrounded by the dielectric layer 208, although a top surface of the trace 207F is exposed through opening 224 formed in the protective dielectric layer 221, such that the conductive redistribution layer 231 is in direct electrical and mechanical contact with the trace 207F, meaning that there are no intervening materials or layers in between. Other exposed metal traces of the second metal layer 207 may also be in direct electrical and mechanical contact with the conductive redistribution layer 231, as well, through corresponding openings through the protective dielectric layer 221. For example, the trace 207A directly contacts the conductive redistribution layer 231 through opening 225 formed in the protective dielectric layer 221. The openings 224 and 225 may be formed by known patterning and etching techniques, for example. By contrast, unexposed metal traces of the second metal layer 207, such as trace 207B and 207E, are covered by the protective dielectric layer 221, and are thus electrically isolated from the conductive redistribution layer 231.

The insulating spacer 229 electrically insolates the trace 206F from the trace 207F, and may be formed of any insulating or dielectric material, such as $Si_3N_4$ or $SiO_2$, for example, that is substantially impervious to moisture. Placement of the insulating spacer 229 between traces 206F and 207F, as depicted in FIG. 2A, enables the trace 206F to be used as an electrical contact to other electrodes inside the moisture barrier 255 without electrically shorting the electrodes to the conductive redistribution layer 231.

Figure 2B:
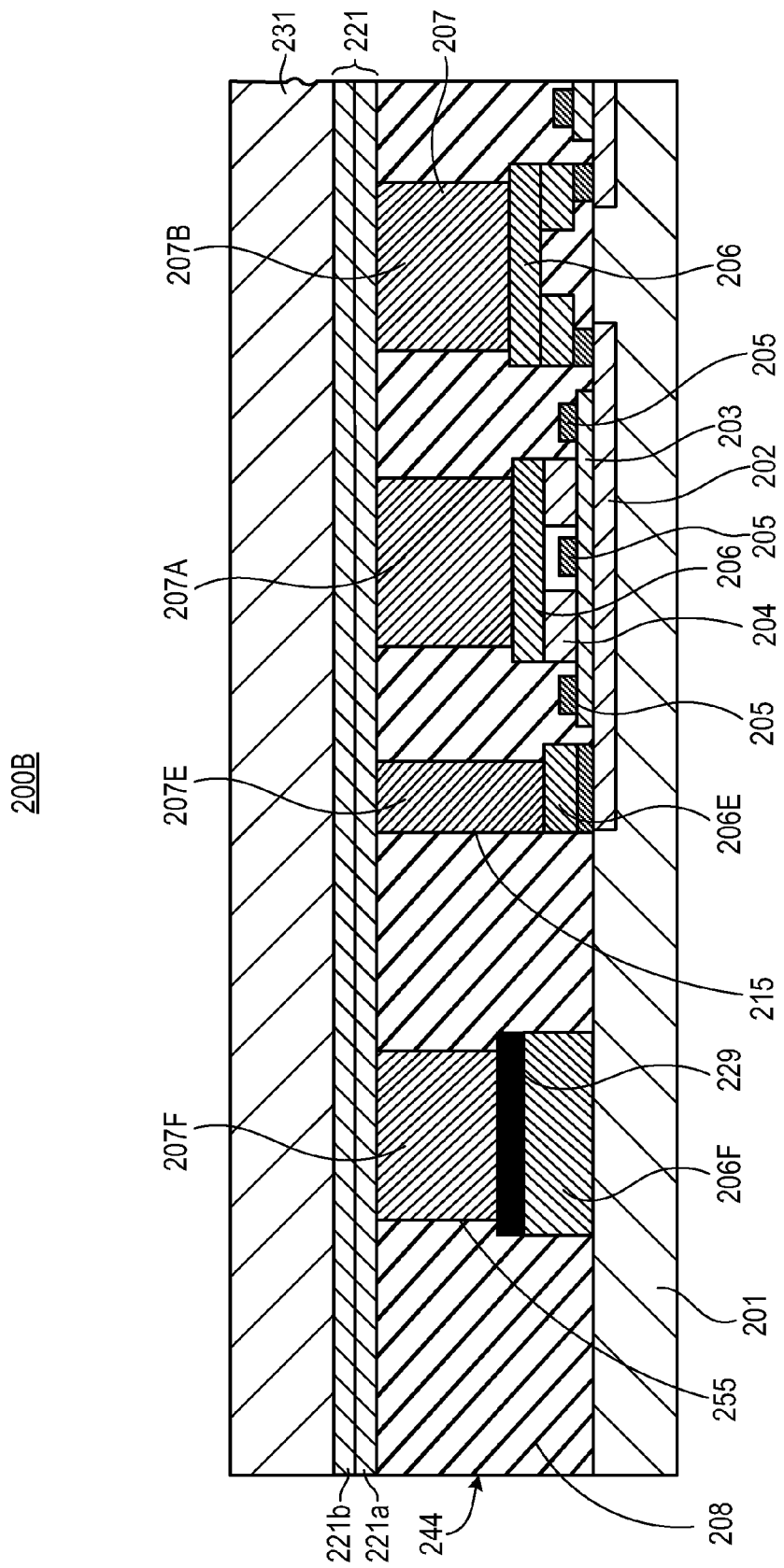

FIG. 2B shows a cross-sectional view of a semiconductor structure 200B in accordance with a representative embodiment. In the depicted embodiment, the protective dielectric layer 221 does not include the opening 224. Thus, the top surface of the trace 207F of the moisture barrier 255 is not in direct electrical and mechanical contact with the conductive redistribution layer 231. However, the conductive redistribution layer 231 and the moisture barrier 255 still form a closed compartment through the indirect contact, with the protective dielectric layer 221 in between, that houses the electrical components (active and passive) of the semiconductor structure 200A, while being electrically insulated from one another. Otherwise, the configuration of the semiconductor structure 200B is substantially the same as that of semiconductor structure 200A, discussed above.

Figure 2C:
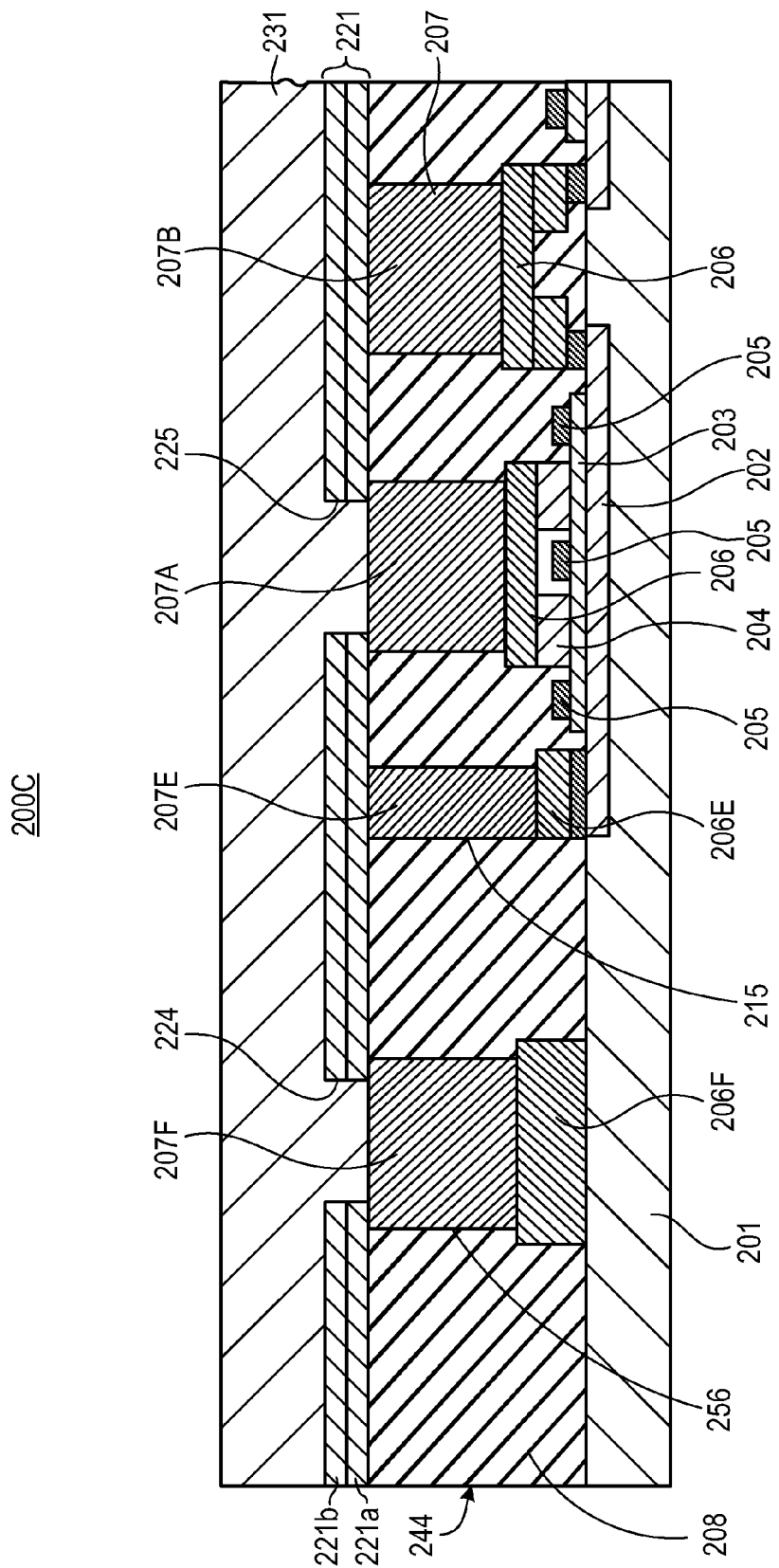

FIG. 2C shows a cross-sectional view of a semiconductor structure 200C in accordance with a representative embodiment. Some of the features of semiconductor structure 200C are common to the semiconductor structure 200A. Details of these common features may not be repeated so as to avoid obscuring the details of the presently described embodiments.

In particular, FIG. 2C shows a cross-sectional view of a semiconductor structure 200C, which includes moisture barrier 256, in accordance with another representative embodiment. In FIG. 2C, the moisture barrier 256 includes trace 206F of the first metal layer 206 on substrate 201, and trace 207F of the second metal layer 207 stacked directly on the trace 206F, making direct electrical and mechanical contact. The moisture barrier 256 is surrounded by the dielectric layer 208, although a top surface of the trace 207F is exposed, such that the conductive redistribution layer 231 is in direct electrical and mechanical contact with the trace 207F. Thus, the trace 206F of the moisture barrier 256 may be grounded via the trace 207F and the conductive redistribution layer 231. The surface of the dielectric layer 208 may be substantially flush with the surface of the second metal layer 207, as discussed above.

Figure 2D:
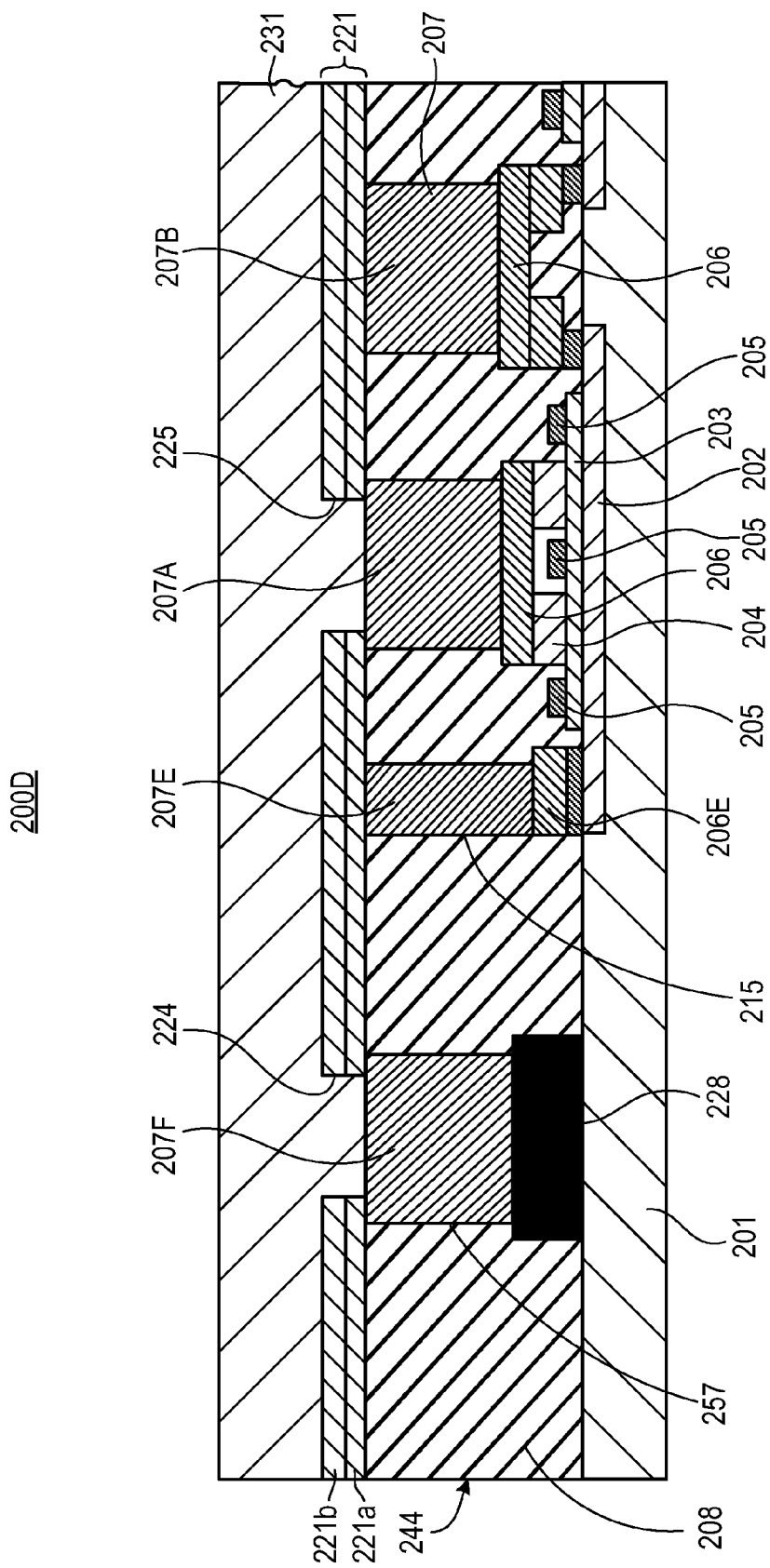

FIG. 2D shows a cross-sectional view of a semiconductor structure 200D in accordance with a representative embodiment. Some of the features of semiconductor structure 200D are common to the semiconductor structure 200A. Details of these common features may not be repeated so as to avoid obscuring the details of the presently described embodiments.

In particular, FIG. 2D shows a cross-sectional view of a semiconductor structure 200D, which includes moisture barrier 257, in accordance with another representative embodiment. In the depicted embodiment, the moisture barrier 257 includes insulating spacer 228 on substrate 201, and trace 207F of the second metal layer 207 stacked on the insulating spacer 228. The moisture barrier 257 is surrounded by the dielectric layer 208, although a top surface of the trace 207F is exposed, such that the conductive redistribution layer 231 is in direct electrical and mechanical contact with the trace 207F. The surface of the dielectric layer 208 may be substantially flush with the surface of the second metal layer 207, as discussed above. The insulating spacer 228 may be formed of any insulating or dielectric material, such as $Si_3N_4$ or $SiO_2$, for example, that is substantially impervious to moisture. Using the insulating spacer 228 depicted in FIG. 2C in place of the trace 206F enables separation of the first metal layer 206 from the trace 207F of the second metal layer 207, and use of the first metal layer 206 to electrically contact other structures under the conductive redistribution layer 231.

As discussed above in regard to the moisture barrier 255, the moisture barriers 256 and 257 peripherally surround the entire circuitry of the semiconductor structure 200C and 200D, respectively, including the depicted illustrative HBT and other (active or passive) semiconductor devices, thus forming guard rings closed over by the conductive redistribution layer 231 to protect against moisture. The moisture barriers 256 and 257 would appear substantially the same as the moisture barrier 255 shown in FIG. 6.

The representative moisture barriers 255, 256 and 257 may be included in other types of semiconductor structures, including representative semiconductor structures 300, 400 and 500, which have pillars in thermal and/or electrical communication with HBTs or other semiconductor devices, as discussed below. Examples of semiconductor structures having moisture barriers and pillars are described by Wholey et al. in U.S. patent application Ser. No. 13/075,493 (filed Mar. 30, 2011), which is a continuation-in-part of U.S. patent application Ser. No. 12/846,060 (filed Jul. 29, 2010) by Parkhurst et al., both of which are hereby incorporated by reference. Further, the representative moisture barriers 255, 256 and 257 may be included with semiconductor structures having various active and passive electrical components in addition to or instead of HBTs, as discussed above. Illustratively, active devices may include a pseudomorphic high electron mobility transistor (pHEMT), an enhanced pseudomorphic high electron mobility transistor (E-pHEMT), or a metal oxide semiconductor (MOS) device such as a MOS field effect transistor (MOSFET) or complementary MOS (CMOS) device. Also, passive electrical components may include resistors, capacitors, signal transmission lines (transmission lines) and inductors, for example.

Figure 3:
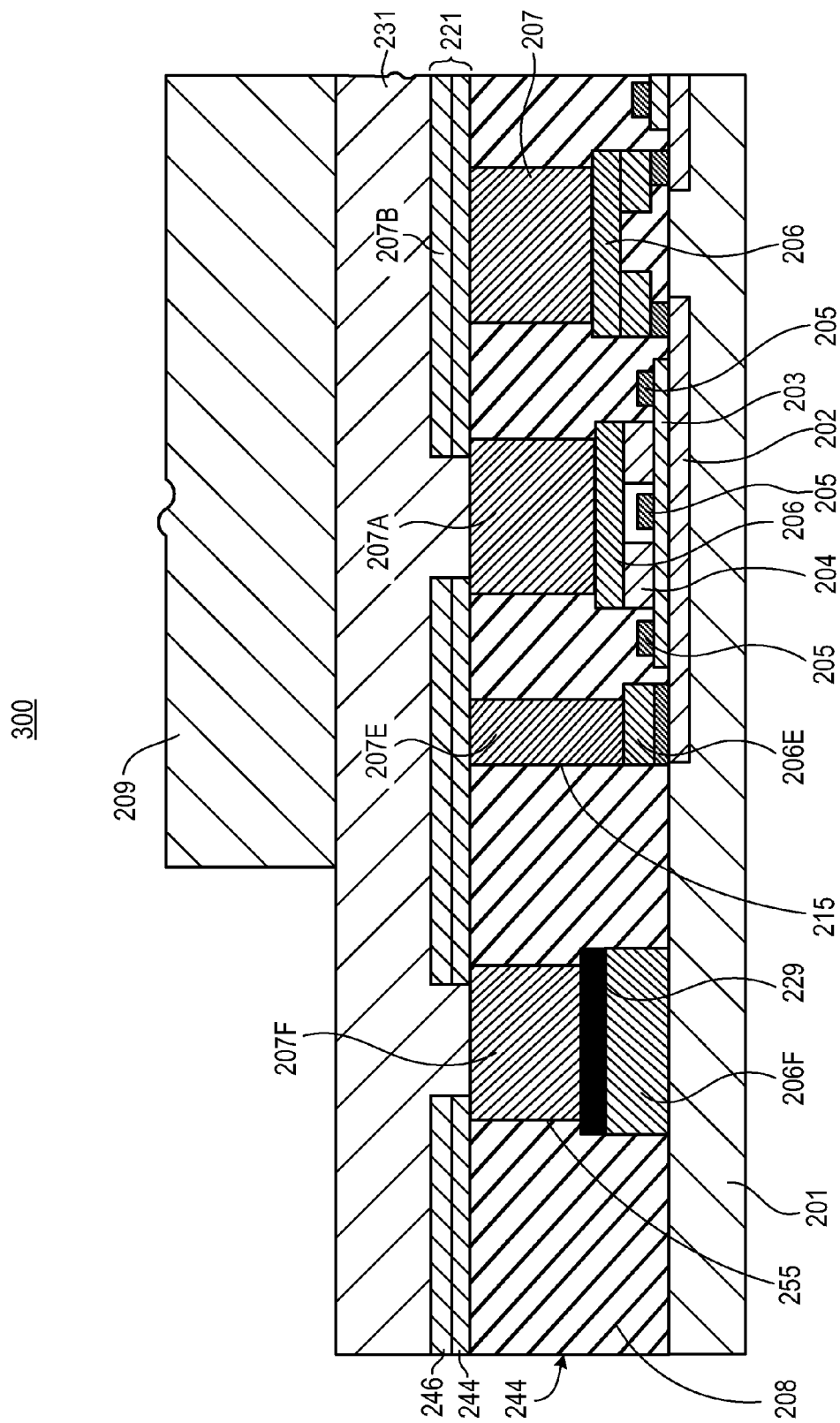
FIG. 3 shows a cross-sectional view of a semiconductor structure with moisture barrier and conductive redistribution layer connected with a pillar in accordance with representative embodiments.

FIG. 3 shows a cross-sectional view of a semiconductor structure with moisture barrier and conductive redistribution layer connected with a pillar in accordance with representative embodiments.

Figure 5:
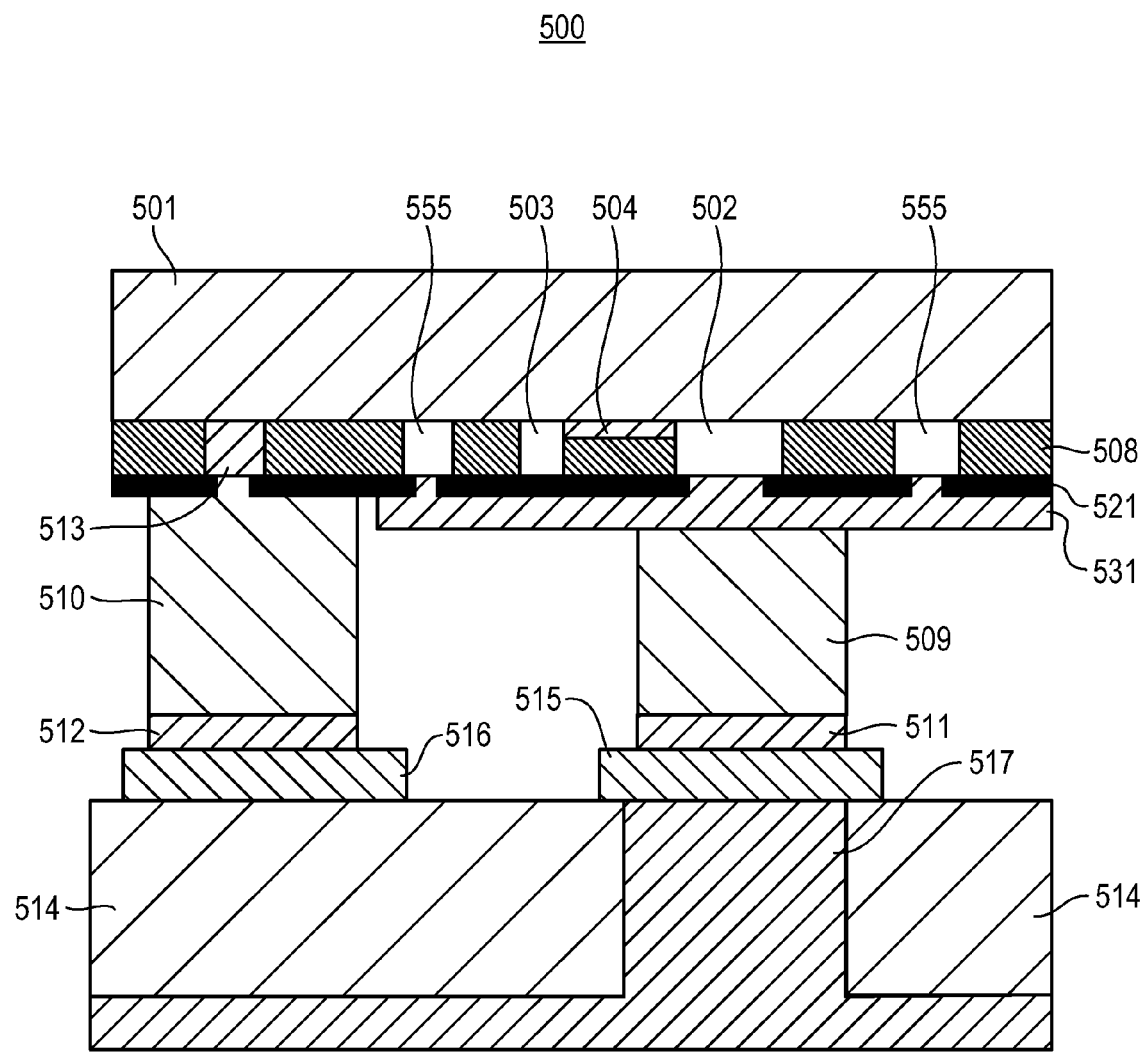
FIG. 5 shows a cross-sectional view of a semiconductor structure in accordance with a representative embodiment.

Referring to FIG. 3, semiconductor structure 300 includes electrically conductive pillar ("pillar") 209 in electrical and mechanical contact with a top surface of conductive redistribution layer 231. Otherwise, the semiconductor structure 300 is configured substantially the same as the semiconductor structure 200A in FIG. 2A, discussed above. The pillar 209 provides a thermal path to transfer heat from the HBT (or other active semiconductor device of the semiconductor structure 300) and passive electrical components via the conductive redistribution layer 231, and provides selective electrical connections to the second metal layer 207. Notably, when the conductive redistribution layer 231 is a ground connection, the pillar 209 conducts ground signals and provides paths for thermal dissipation of heat. As described more fully below, the semiconductor structure 300 generally includes more than one pillar 209, with each pillar 209 being connected to different active semiconductor devices, or passive electrical components, or both, located in/over different areas of the substrate 201. The pillar(s) 209 may be connected to a second substrate (e.g., as shown in FIG. 5), which includes external circuitry (not shown) to include active semiconductor devices, passive electrical components and ground connections (e.g., conductive vias). The external circuitry of the second substrate in turn may be connected to further external circuitry (also not shown), which also may include active and passive semiconductor devices and ground connections.

Figure 6:
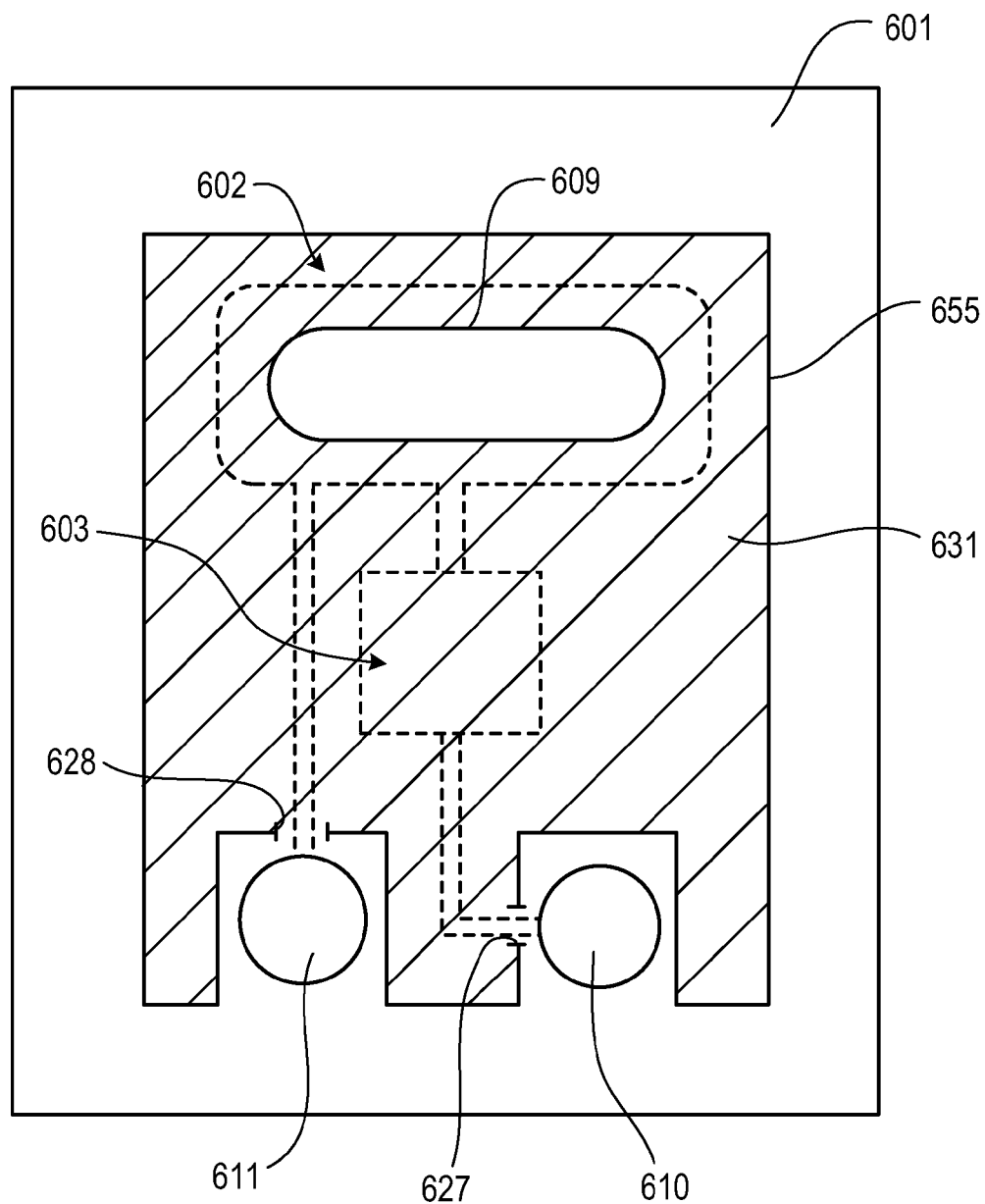
FIG. 6 shows a top view of the semiconductor structure of FIGS. 2A-3 with moisture barrier and conductive redistribution layer in accordance with a representative embodiment.

Depending on the selected connection of the pillar 209 to external circuitry, the pillar 209 can provide ground connections or input/output signal connections for active semiconductor devices, or passive electrical components, or both, of the semiconductor structure 300. A pillar 209 that provides ground connections may be referred to as a "ground pillar," and a pillar 209 that provides input/output signal connections may be referred to as a "signal pillar." When the pillar 209 provides input/output signal connections, it must directly contact the corresponding metal trace of the second metal layer 207 and pass through the (grounded) conductive redistribution layer 231 without making electrical contact. Alternatively, when a pillar provides input/output signal connections, it may be located outside the moisture barrier 255 and the conductive redistribution layer 231, as shown in FIG. 6, for example. When the pillar 209 provides ground connections, it is electrically connected to ground traces of the second metal layer 207 (as shown in FIG. 3) for conducting ground signals. Regardless of whether metal traces of the second metal layer 207 are electrically connected to or isolated from the pillar 209, heat is dissipated from the second metal layer 207 through the pillar 209 through the protective dielectric layer 221 and/or the conductive redistribution layer 231.

Illustratively, the pillar 209 is in direct contact with and is disposed directly on the conductive redistribution layer 231, which is in direct contact with and is disposed directly on trace 207A (and trace 207F) of the second metal layer 207. Thus, trace 207A of the second metal layer 207 electrically connects the pillar 209 to the first metal layer 206, and ultimately to the emitter of the HBT as shown. Trace 207A of the second metal layer 207 provides both an electrical conduction path and a thermal conduction path from the emitter 204 of the HBT. By contrast, trace 207B of the second metal layer 207 (and trace 270E) is electrically isolated from the pillar 209 by the protective dielectric layer 221. Accordingly, the collector 202 of the HBT is electrically isolated from the pillar 209. However, the mechanical connection between the collector 202, the protective dielectric layer 221, the conductive redistribution layer 231 and the pillar 209 provides a thermal path for conduction of heat from the collector 202 of the HBT via the trace 207B of the second metal layer 207 to the pillar 209 through the protective dielectric layer 221.

The dielectric layer 208 is deposited conformally over the HBT, the contacts 205, the first metal layer 206 and the second metal layer 207, and then planarized, by known deposition and planarization methods. The protective dielectric layer 221 is deposited conformally over the dielectric layer 208 likewise by a known deposition method. Selective etching by known masking and plasma etching techniques removes the dielectric from the upper surfaces of the selected traces (e.g., traces 207A and 207F) of the second metal layer 207 to allow for selective electrical connection between the conductive redistribution layer 231 and the second metal layer 207. By not removing the protective dielectric layer 221 from selected traces (e.g., traces 207B and 207E), the dielectric layer 208 provides selective electrical isolation of second metal layer 207 and the conductive redistribution layer 231 (as well as the pillar 209). As noted, in certain embodiments, the dielectric layer 208 and/or the protective dielectric layer 221 include a material having comparatively good thermal conductivity, which improves the dissipation of heat from the underlying active semiconductor device (e.g., the HBT), through the contacts 205, the first metal layer 206, and the second metal layer 207.

The pillar 209 illustratively includes copper formed by a known method such as evaporation or plating. The pillar 209 has sufficient thickness for providing both current carrying capability from the second metal layer 207 (e.g., through traces 207A and 207F) and heat dissipation from the second metal layer 207 (e.g., through traces 207A, 207B, 207E and 207F). Typically, the pillar 209 includes copper having a thickness in the range of approximately 10 µm to approximately 100 µm and greater than 100 µm, for example. The thermal and electrical conductivity of copper are advantageous over other conductors such as gold. However, other electrically and thermally conductive materials are contemplated for use as the pillar 209. Illustratively, the pillar 209 may include silver or a solder material such as tin. The silver may be deposited by a known method, and solder may be applied using known solder bump deposition methods.

In certain embodiments, the pillar 209 includes a single layer of the selected conductive material (e.g., copper). It is emphasized that this is merely illustrative, and the pillar 209 may comprise more than one layer of the selected conductive material (e.g., multiple layers of copper). Alternatively, the pillar 209 may include layers of different materials. For example, in certain embodiments the pillar 209 includes a comparatively thick (e.g., 45 µm) layer of copper and a layer of solder (e.g., 30 µm), such as SnAg or SnCu solder disposed over the layer of copper. Still alternatively, the pillar 209 may include a first layer of copper having a thickness of approximately 10 µm disposed immediately over the upper-most metal layer (second metal layer 207 in the illustrative embodiment) and making selective electrical contact therewith; a second layer of copper having a thickness of approximately 35 µm disposed over the first layer of copper; and a layer of solder (e.g., SnAg or SnCu) having a thickness of approximately 35 µm disposed over the second layer of copper.

Figure 4:
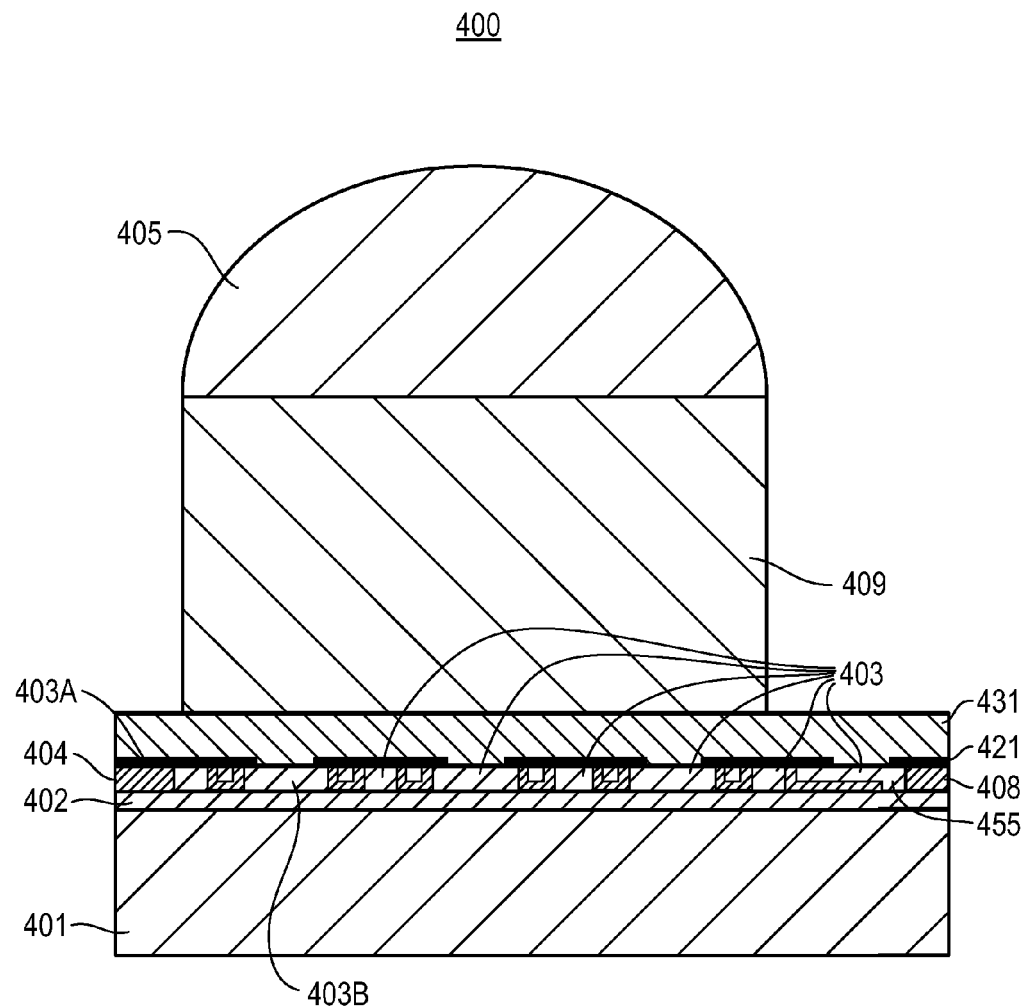
FIG. 4 shows a cross-sectional view of a semiconductor structure in accordance with a representative embodiment.

FIG. 4 shows a cross-sectional view of a semiconductor structure 400 in accordance with a representative embodiment. Some of the details of the representative embodiments described in connection with FIGS. 2A~3 are common to the presently described representative embodiment. Some of the common details are not repeated in order to avoid obscuring the description of the present embodiment. For example, details of representative materials and methods of fabricating features of the semiconductor structure 400 are generally not repeated.

Referring to FIG. 4, the semiconductor structure 400 includes a substrate 401 and a passive electrical component layer 402 provided thereover. The passive electrical component layer 402 includes passive electrical components disposed thereover, or formed therein, or both, to provide the passive electrical components of the semiconductor structure 400. It is contemplated that the passive electrical component layer 402 not be a separate and distinct layer from the substrate 401, but rather may be a portion of the substrate 401 over which or in which passive electrical (or both) components are provided. The passive electrical components may be resistors, capacitors, transmission lines, and inductors, such as described above and fabricated using known methods and materials.

A metal layer 403 is provided over the passive electrical component layer 402. Notably, the metal layer 403 is the only metal layer of the semiconductor structure 400 and provides all current handling requirements for the underlying passive electrical components. The metal layer 403 provides selective electrical connection to the passive electrical components. Illustratively, the metal layer 403 comprises gold and has a thickness of approximately 2.0 µm. With such a thickness, the features size of the traces of the metal layer 403 is approximately 2.0 µm; and the pitch of adjacent features is approximately 4.0 µm, for example. An outer most trace of the metal layer 403 forms an illustrative moisture barrier 455.

A base dielectric layer 404 is disposed on the metal layer 403 and planarized, exposing the top surfaces of the traces formed by the metal layer 403. A protective dielectric layer 421 is provided over the planarized top surfaces of the metal layer 403 and the dielectric layer 404, as shown. As discussed above with reference to the protective dielectric layer 221, the protective dielectric layer 421 may be formed of first and second dielectric layers (not shown in FIG. 4), where the first dielectric layer may be formed of $Si_3N_4$ having a thickness of about 0.3 µm and the second dielectric layer may be formed of BCB having a thickness of about 2.0 µm, for example. A conductive redistribution layer 431 is provided on a planar top surface of the protective dielectric layer 421 and contacting the moisture barrier 455, forming a substantially closed compartment that houses the illustrative passive electrical components of the semiconductor structure 400. The conductive redistribution layer 431 may be formed of copper and/or other conductive metal material, for example. As discussed above, the moisture barrier 455 is located near the outer edge of the substrate 401 (only one of which is shown in FIG. 4), and peripherally surrounds the circuitry of the semiconductor structure 400 (including the passive electrical components) to form a guard ring.

An electrically conductive pillar ("pillar") 409 is provided on the conductive redistribution layer 431, over portions of the base dielectric layer 404 and the metal layer 403 forming the passive electrical components. The electrical connection between the passive electrical components of the passive electrical component layer 402, the conductive redistribution layer 431 and the pillar 409 may provide a input/output signal connections or ground connections, depending on the connection of the pillar 409 to external circuitry (not shown). As noted above, the present teachings contemplate multiple pillars 409 selectively connected (electrically or thermally, or both) to different areas of the substrate 401, and to passive electrical components disposed thereover and formed therein. To the extent that the pillar 409 and the conductive redistribution layer 431 provide different connections (e.g., signal connection and ground connection, respectively), the pillar 409 must pass through and be electrically isolated from the conductive redistribution layer 431 (not shown) to connect directly with the metal layer 403, or the pillar 409 must be located outside the guard ring, formed by the moisture barrier 455, and the covering conductive redistribution layer 431.

The pillar 409 may be formed of copper, for example, and have a thickness of approximately 65 μm, for example. The pillar 409 may include multiple layers of the same or different materials as described above. An optional solder bump 406 is provided over the pillar 409. The solder bump 406 illustratively includes an alloy of copper and tin and has a thickness of approximately 25 μm to approximately 30 μm.

The protective dielectric layer 421 is provided over a surface of a trace 403A of the metal layer 403 and between the metal layer 403 and the conductive redistribution layer 431. Thus, the conductive redistribution layer 431 is not in direct contact with trace 403A, but instead is in direct contact with and is disposed on the protective dielectric layer 421. The protective dielectric layer 421 thereby electrically isolates the trace 403A from the conductive redistribution layer 431, as well as the pillar 409. However, the protective dielectric layer 421 and the conductive redistribution layer 431 provide a mechanical connection between the trace 403A and the pillar 409. As described above, this mechanical connection fosters heat dissipation from the trace 403A to the pillar 409. Accordingly, heat from the underlying semiconductor device can be dissipated through the pillar 409.

By contrast, the protective dielectric layer 421 is removed (e.g., by etching) from a top surface of a trace 403B of the metal layer 403. As such, the conductive redistribution layer 431 is in direct contact with and is disposed directly on trace 403B of the metal layer 403. Thus, trace 403B of the metal layer 403 electrically connects the conductive redistribution layer 431 and thus the pillar 409 to the passive electrical components. Depending on the connection of the pillar 409 to the external circuitry (not shown), the electrical connection between the trace 403B and the pillar 409 will be either an electrical signal connection or an electrical ground connection. Accordingly, the removal of the protective dielectric layer 421 from surface of the trace 403B provides an electrical connection and a mechanical connection between the trace 403B of the metal layer 403 and the pillar 409. Thereby, electrical and thermal connection can be made from the underlying semiconductor device through the metal layer 403 to the pillar 409.

FIG. 5 shows a cross-sectional view of a semiconductor structure 500 in accordance with a representative embodiment. Some of the details of the representative embodiments described in connection with FIGS. 2A-4 are common to the presently described representative embodiment. Some of the common details are not repeated in order to avoid obscuring the description of the present embodiment. For example, details of representative materials and methods of fabricating features of the semiconductor structure 500 are generally not repeated.

The semiconductor structure 500 includes a first substrate 501, which illustratively includes a semiconductor material. The selection of the semiconductor material of the first substrate 501 is generally dictated by the active semiconductor device(s) to be implemented thereon. The semiconductor structure 500 includes a representative active semiconductor device 502 and a representative passive electrical component 503. Illustratively, the active semiconductor device 502 may include an HBT and the passive electrical component 503 may include a resistor. It is emphasized that these are merely illustrative, and that other active semiconductor devices and other passive electrical components are contemplated. The semiconductor structure 500 further includes a representative moisture barrier 555, which acts as a guard ring surrounding the active semiconductor device 502 and the passive electrical component 503. Details of the corresponding structures of the active semiconductor device 502, the passive electrical component 503, and the moisture barrier 555 are omitted for clarity. Examples of such details are described above with reference to FIGS. 2A-4. Generally, the active semiconductor device 502 includes emitter traces, base traces and collector traces (not shown), as discussed above. In keeping with the convention set forth in connection with the embodiment of FIG. 2A, for example, the emitter traces are illustratively components of a second (upper-most) metal layer of the semiconductor structure 500.

Dielectric layer 508 is generally provided between the various components, including the active semiconductor device 502, the passive electrical component 503 and the moisture barrier 555. The dielectric layer 508 is also provided over a transmission line 504 on the first substrate 501, electrically connected to the passive electrical component 503. Protective dielectric layer 521 is selectively provided over the dielectric layer 508, the active semiconductor device 502, the passive electrical component 503 and the moisture barrier 555. Conductive redistribution layer 531 is provided over the protective dielectric layer 521, forming a protective closed compartment defined by the conductive redistribution layer 531 and the moisture barrier 555. The compartment contains the active semiconductor device 502 and the passive electrical component 503, as well as other active and passive semiconductor devices (not shown). The selective disposition of the protective dielectric layer 521 provides electrical isolation of selected traces of the active semiconductor device 502 and passive electrical component 503 from the conductive redistribution layer 531. Examples of further details regarding the moisture barrier 555, the protective dielectric layer 521 and the conductive redistribution layer 531 are described above with reference to the moisture barriers 255, 256, 257, 455, the protective dielectric layers 221, 421 and the conductive redistribution layers 231, 431 in FIGS. 2A-4, above.

The semiconductor structure 500 includes a first pillar 509 and a second pillar 510 disposed over the first substrate 501. In the depicted example, because of the selection of electrical connections to the first and second pillars 509 and 510, the first pillar 509 is a "ground pillar" and the second pillar 510 is a "signal pillar." Also, in the depicted example, the second pillar 510 is located outside the protective compartment defined by the conductive redistribution layer 531 and the moisture barrier 555. This is because the second pillar 510 is a signal pillar providing input/output signal connections, and therefore cannot contact the grounded conductive redistribution layer 531. Alternative, the second pillar 510 may extend through an opening in the conductive redistribution layer 531, the edges of which may be sealed using an insulting material to ensure electrical separation of the second pillar 510 and the conductive redistribution layer 531, while maintaining the integrity of the protective compartment.

In the representative embodiment shown in FIG. 5, the first pillar 509 includes a first solder bump 511, and the second pillar 510 includes a second solder bump 512. As noted above, the present teachings contemplate multiple ground pillars (e.g., first pillar 509) and multiple signal pillars (e.g., second pillar 510) selectively connected (electrically or thermally, or both) to different areas of the first substrate 501, and to active semiconductor devices and passive electrical components disposed thereover and formed therein.

A signal trace 513 electrically connects the passive electrical component 503 to the second pillar 510 via a conductor (not shown) that passes through a gap (not shown) in the moisture barrier 555, as discussed below. This electrical connection is effected by selectively removing the protective dielectric layer 521 over the signal trace 513. Other components requiring signal connections would similarly connect with the second pillar 510 through the same or different gaps in the moisture barrier 555.

In the depicted example, in which it is assumed that the emitter of the representative active semiconductor device 502 (e.g., HBT) is connected to ground, the emitter traces (not shown) of the active semiconductor device 502 are electrically connected to the first pillar 509 via the conductive redistribution layer 531. In the representative embodiment, the first pillar 509 is disposed directly on and in direct contact with the conductive redistribution layer 531. As such, the emitters of the active semiconductor device 502 are electrically connected to the first pillar 509. By contrast, the protective dielectric layer 521 is provided between the base and collector traces (not shown) of the active semiconductor device 502, the transmission line 504 and the passive electrical component 503. As such, the bases and the collectors of the active semiconductor device 502, the transmission line 504 and the passive electrical component 503 are electrically isolated from the first pillar 509. However, and as described above in detail in connection with representative embodiments, the protective dielectric layer 521 and the protective dielectric layer 521 provide a mechanical connection between the second pillar 510 and the isolated traces, contacts, passive electrical components and portions of the active semiconductor devices of the semiconductor structure 500. This mechanical connection provides a thermal path for dissipating heat from the semiconductor structure 500 as well as provides a more robust mechanical structure.

The first and second pillars 509, 510 are connected to a second substrate 514. The second substrate 514 is illustratively a printed circuit board or similar substrate that connects the active semiconductor devices and passive electrical components disposed over or in the first substrate 501 to electrical circuits (not shown) disposed over the second substrate 514, or formed therein, or connected thereto, or a combination thereof. Illustratively, known substrates including FR4, FR5, epoxy laminate, High Density Interconnect (HDI) substrates, Low Temperature Cofired Ceramic (LTCC) substrates, Thin Film on Ceramic substrates and Thick Film on Ceramic substrates are contemplated. The second substrate 514 comprises electrical circuitry comprising active semiconductor devices (not shown), or passive electrical components (not shown), or both, provided thereon or thereover. This electrical circuitry comprises the "external circuitry" alluded to above, and can be connected to additional electrical circuitry (not shown) connected to the electrical circuitry of the second substrate 514.

A printed circuit ground trace 515 is provided between the first pillar 509 and the second substrate 514. A printed circuit signal trace 516 is provided between the second pillar 510 and the second substrate 514. A via 517 is in contact with the printed circuit ground trace 515 and provides a thermal path for dissipation of heat, as well as an electrical ground for connection to the first pillar 509.

The semiconductor structure 500 of the representative embodiment provides two pillars (first pillar 509 and second pillar 510) over a common substrate (first substrate 501), which provide selective electrical and thermal connections to another substrate (second substrate 514). The configuration allows for the connection of electrical signals traces and electrical ground traces to be selectively connected to the printed circuit ground trace 515 and the printed circuit signal trace 516 as shown. Moreover, the first pillar 509 and the second pillar 510 foster dissipation of heat from the active semiconductor devices and passive electrical components provided over the first substrate 501.

It is emphasized that the configuration of the semiconductor structure 500 is merely illustrative. Notably, rather than connecting the emitter traces of the active semiconductor device 502 (e.g., the HBT) electrically to ground through the connection of the first pillar 509 to the printed circuit ground trace 515, the emitter traces could be connected to the printed circuit signal trace 516. Such connections would result from the variation of the connection of the first pillar 509 and the second pillar 510 to the respective signal and ground traces, as would be apparent to one of ordinary skill in the art. Similarly, the passive electrical component 503 could be connected electrically to ground through the connection of the second pillar 510 to the printed circuit signal trace 516. Moreover, the present teachings contemplate that both the first pillar 509 and the second pillar 510 are electrically connected to the printed circuit ground trace 515 or both are connected to the printed circuit signal trace 516. In this manner the connection of the passive electrical components and active semiconductor devices provided over the first substrate 501 can be electrically connected as desired to the second substrate 514 and the circuitry thereon or connected thereto.

Regardless of the electrical connections of the first pillar 509 and the second pillar 510, both pillars provide a thermal path for heat dissipation. This path of heat dissipation may be provided through the protective dielectric layer 521 and the conductive redistribution layer 531 in instances where the protective dielectric layer 521 provides electrical isolation of underlying signal traces; and through just the conductive redistribution layer 531 to the pillars where the protective dielectric layer 521 is selectively removed from over the underlying signal trace.

FIG. 6 shows a top view of the semiconductor structure of FIGS. 2A-5 with moisture barrier and conductive redistribution layer in accordance with a representative embodiment. As should be appreciated by one of ordinary skill in the art, the fabrication sequence that results in the semiconductor structure depicted in FIG. 6 is so-called "front-end" processing. A subsequent fabrication sequence to provide the pillars and, as described below, to provide attachment to subsequent substrates (not shown in FIG. 6) and structures is so-called "back-end" processing.

Referring to FIG. 6, semiconductor structure 600 includes a substrate 601, which illustratively includes a semiconductor material. The selection of the semiconductor material of the substrate 601 is generally dictated by the active semiconductor device(s) to be implemented thereon. The representative active semiconductor device(s) 602 and representative passive electrical component(s) 603 are formed on or in the substrate 601. Moisture barrier 655 surrounds the active semiconductor device(s) 602 and the passive electrical component(s) 603, forming a guard ring. Conductive redistribution layer 631 is formed on top of the moisture barrier 655, creating a protective compartment in which the active semiconductor device(s) 602 and the passive electrical component(s) 603 have been formed, as indicated by the dashed lines. Thus, the conductive redistribution layer 631 and the moisture barrier 655 insulate and otherwise protect the active semiconductor device(s) 602 and the passive electrical component(s) 603 from moisture, and other potentially destructive environmental forces. The materials, dimensions, arrangements and formation of these various features are as discussed above with regard to FIGS. 2A-5, and therefore such details are not repeated. Examples of further details regarding the moisture barrier 655 and the conductive redistribution layer 631 are described above with reference to the moisture barriers 255, 256, 257, 455, 555 and the conductive redistribution layers 231, 431, 531 in FIGS. 2A-5, above.

The semiconductor structure 600 further includes three representative pillars, including ground pillar 609 and signal pillars 610 and 611. As discussed above with reference to FIGS. 3-5, the ground pillar 609 is formed directly on the conductive redistribution layer 631 over the large, heat dissipating active semiconductor device(s) 602, and the signal pillars 610 and 611 are formed outside of the protective compartment defined by the conductive redistribution layer 631 and the moisture barrier 655.

As shown in FIG. 6, in an embodiment, gaps 627 and 628 are formed in portions of the moisture barrier 655 to enable electrical connections between the passive electrical component(s) 603 and the signal pillar 610, and between the active semiconductor device(s) 602 and the signal pillar 611, respectively. The gaps 627 and 628 assure that various design rule checks are satisfied, such as no "donut structures" for the moisture barrier 655. Each of the gaps 627 and 628 should be small, for example, approximately 4 μm, although the sizes and positions of the gaps 627 and 628 may vary, or the gaps 627 and 628 may be excluded, in various alternative configurations. In order to accommodate the moisture barrier 655, the ground pillar 609 is substantially oval shaped and may include copper having a thickness of approximately 65 μm and maximum oval dimensions of approximately 120 μm by 700 μm per the current maximum design rule, for example. The signal pillars 610 and 611 may include copper also having a thickness of approximately 65 μm and a minimum diameter of approximately 75 μm per the current minimum design rule, for example. As stated above, the thermal and electrical conductivity of copper are advantageous over other conductors, such as gold. However, other electrically and thermally conductive materials are contemplated for use as the ground and signal pillars 209, 210 and 211.

In view of this disclosure it is noted that the various semiconductor structures and active semiconductor devices can be implemented in a variety of materials and variant structures. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

The invention claimed is:

1. A semiconductor structure comprising:
a plurality of semiconductor devices on a substrate;
a moisture barrier on the substrate surrounding the plurality of semiconductor devices;
a metal conductive redistribution layer formed over the moisture barrier, the metal conductive redistribution layer and the moisture barrier defining a closed compartment containing the plurality of semiconductor devices; and
a protective dielectric layer disposed between the moisture barrier and the metal conductive redistribution layer.

2. The semiconductor structure of claim 1, wherein the conductive redistribution layer directly contacts the moisture barrier through an opening in the protective dielectric layer to define the closed compartment.

3. The semiconductor structure of claim 1, wherein the metal conductive redistribution layer indirectly connects with the moisture barrier through the protective dielectric layer to define the closed compartment.

4. The semiconductor structure of claim 1, further comprising:
a conductive pillar disposed directly on and in electrical contact with a surface of the metal conductive redistribution layer over at least one of the plurality of semiconductor devices, the conductive pillar being configured to provide a thermal path to transfer heat from the at least one of the plurality of semiconductor devices.

5. The semiconductor structure of claim 4, wherein the conductive pillar and the metal conductive redistribution layer are electrically connected to ground.

6. The semiconductor structure of claim 1, further comprising:
a conductive pillar disposed on the substrate outside the closed compartment defined by the metal conductive redistribution layer and the moisture barrier, and electrically connected to at least one of the plurality of semiconductor devices through a gap formed in the moisture barrier.

7. The semiconductor structure of claim 6, wherein the metal conductive redistribution layer is electrically connected to ground and the conductive pillar is electrically connected to receive signals other than ground signals.

8. A semiconductor structure, comprising:
a plurality of semiconductor devices on a substrate;
a metal layer disposed over the plurality of semiconductor devices, the metal layer comprising at least a first trace and a second trace;
a moisture barrier on the substrate surrounding the plurality of semiconductor devices substantially along a periphery of the semiconductor structure, the moisture barrier comprising a third trace formed as part of the metal layer; and
a protective dielectric layer disposed on the metal layer over the plurality of semiconductor devices and the moisture barrier; and
a conductive redistribution layer disposed on protective dielectric layer, the conductive redistribution layer and the moisture barrier defining a closed compartment containing the plurality of semiconductor devices.

9. The semiconductor structure of claim 8, further comprising:
a conductive pillar disposed directly on and in electrical contact with the conductive redistribution layer, the conductive pillar being configured to provide a thermal path to transfer heat from at least one of the plurality of semiconductor devices.

10. The semiconductor structure of claim 8, wherein the conductive redistribution layer directly contacts the moisture barrier through an opening in the protective dielectric layer.

11. The semiconductor structure of claim 8, wherein the moisture barrier further comprises an insulating spacer located between the third trace and the substrate.

12. The semiconductor structure of claim 8, wherein the moisture barrier further comprises a fourth trace, which is formed as part of another metal layer disposed between the metal layer and the plurality of semiconductor devices.

13. The semiconductor structure of claim 12, wherein the moisture barrier further comprises an insulating spacer located between the third and fourth traces.

14. The semiconductor structure of claim 13, wherein the insulating spacer comprises one of silicon nitride ($Si_3N_4$) and silicon dioxide ($SiO_2$).

15. A semiconductor structure, comprising:
- a metal layer disposed over a semiconductor device, the metal layer comprising at least a first trace, a second trace and a third trace separated by a base dielectric layer;
- a moisture barrier comprising the third trace of the metal layer;
- a protective dielectric layer selectively disposed on the metal layer;
- a metal conductive redistribution layer disposed on the protective dielectric layer, the conductive redistribution layer and the moisture barrier defining a closed compartment containing the semiconductor device; and
- a conductive pillar on the metal conductive redistribution layer, the conductive pillar being in electrical contact with the first trace of the metal layer via the metal conductive redistribution layer, wherein the protective dielectric layer electrically isolates the second trace from the conductive pillar.

16. The semiconductor structure of claim 15, wherein the metal conductive redistribution layer directly contacts the moisture barrier through an opening in the protective dielectric layer to define the closed compartment.

17. The semiconductor structure of claim 15, wherein the metal conductive redistribution layer indirectly connects with the moisture barrier through the protective dielectric layer to define the closed compartment.

18. The semiconductor structure of claim 1, wherein the metal conductive redistribution layer comprises copper.

* * * * *